United States Patent
Hosokawa

(10) Patent No.: US 7,420,179 B2
(45) Date of Patent: Sep. 2, 2008

(54) ELECTRON MICROSCOPE

(75) Inventor: Fumio Hosokawa, Tokyo (JP)

(73) Assignee: Jeol Ltd., Tokyo (JP)

(*) Notice: Subject to any disclaimer, the term of this patent is extended or adjusted under 35 U.S.C. 154(b) by 164 days.

(21) Appl. No.: 11/526,847

(22) Filed: Sep. 25, 2006

(65) Prior Publication Data
US 2007/0114403 A1    May 24, 2007

(30) Foreign Application Priority Data
Sep. 27, 2005    (JP) .............................. 2005-279537

(51) Int. Cl.
*H01J 37/10* (2006.01)
(52) U.S. Cl. .................. 250/396 ML; 250/398
(58) Field of Classification Search .......... 250/396 ML, 250/398, 310, 311
See application file for complete search history.

(56) References Cited

U.S. PATENT DOCUMENTS 6,555,818 B1 *  4/2003  Hosokawa ................. 250/311
6,836,373 B2    12/2004 Hosokawa
6,930,312 B2 *  8/2005  Matsuya et al. .......... 250/396 R
7,015,481 B2 *  3/2006  Matsuya .................... 250/398

FOREIGN PATENT DOCUMENTS

JP    2003-92078    3/2003

* cited by examiner

*Primary Examiner*—Kiet T Nguyen
(74) *Attorney, Agent, or Firm*—The Webb Law Firm

(57) ABSTRACT

An electron microscope has a spherical aberration correction system having transfer optics inserted between a spherical aberration corrector and the objective lens. The transfer optics consists of first and second lenses each of which is made of a magnetic lens. Electrons passing across a point located at distance r0 from the optical axis are made to enter the first lens within the multipole element. Electrons are made to enter the second lens at distance r1 of the incident point to the objective lens from the optical axis. The ratio M(=r1/r0) is greater than 1.

7 Claims, 3 Drawing Sheets

ELECTRON MICROSCOPE

BACKGROUND OF THE INVENTION

1. Field of the Invention

The present invention relates to an electron microscope having a spherical aberration corrector, such as a transmission electron microscope (TEM) or a scanning transmission electron microscope (STEM).

2. Description of Related Art

In a spherical aberration corrector for use in an electron microscope (such as a transmission electron microscope (TEM) or a scanning transmission electron microscope (STEM)), a so-called magnetic multipole element consisting of plural (four, eight, twelve, or the like) magnetic bodies around which coils are wound is used, the magnetic bodies being disposed on a plane perpendicular to the optical axis, as disclosed in Japanese Patent Laid-Open No. 2003-92078.

Spherical aberration corrector and spherical aberration correction systems described below pertain to a spherical aberration corrector that produces a hexapole field by means of a multipole element for a transmission electron microscope (TEM).

FIG. 3 is a diagram showing the configuration of a spherical aberration correction system 50 which uses a multipole element and is used in an electron microscope. As shown in this figure, a condenser lens 51, an aberration corrector 52, transfer optics 53, an objective lens 54, and a specimen 55 are placed in this order in the spherical aberration correction system 50. In the case of a transmission electron microscope (TEM), an image free of aberrations is formed from the specimen toward the aberration corrector. In the cases of scanning transmission electron microscope (STEM) and scanning electron microscope (SEM), an image of the light source is formed from the aberration corrector toward the specimen without producing aberrations.

The transfer optics built in the spherical aberration correction system of the electron microscope acts to make the working surface of the aberration corrector and the aberration introduction surface of the objective lens optically equivalent within the range of the primary orbit. Usually, the transfer optics is made up of two or one magnetic lenses having a principal plane. The transfer optics 53 shown in FIG. 3 consists of two lenses, i.e., first lens 53a and second lens 53b. The transfer optics made are not intended to show magnifying or demagnifying capabilities, which the lenses should intrinsically exhibit. The optics is designed such that the objective lens 54 and spherical aberration corrector 52 together focus light at a magnification of 1. Where the magnification is not 1, the magnification is close to 1.

SUMMARY OF THE INVENTION

It is an object of the present invention to provide an electron microscope having a spherical aberration correction system that operates efficiently by preventing intrusion of undesired aberrations.

An electron microscope according to the present invention achieves the above-described object and has a spherical aberration corrector and an objective lens. The corrector uses a multipole element. Transfer optics is mounted between the multipole element and the objective lens. In the transfer optics, at least one of coil current I flowing through the multipole element and a bore radius b of the multipole element is so set that the ratio (M=r1/r0) of distance r1 to distance r0 is set to greater than 1 and that the spherical aberration coefficient $C_{st}$ of the objective lens including contribution $X_0$ from the spherical aberration corrector is restricted to within a given value. The distance r1 is the distance from the optical axis to the incident point for electrons to the objective lens, the electrons passing across a location that is at the distance r0 from the optical axis within the multipole element.

Preferably, the given value is 0.05 mm. More preferably, the given value is 0.01 mm. Most preferably, the given value is 0.005 mm.

Preferably, the ratio M is more than 1.5.

Preferably, the multipole element of the spherical aberration corrector uses a hexapole field, and the bore radius b of the multipole element is set to 2 to 3 mm.

Preferably, the multipole element of the spherical aberration corrector uses a hexapole field, and the ratio M is defined as $$M = \left( \frac{6 f^4 Z^3 \mu_0^2 I^2}{C_s R^2 b^6} \right)^{1/4}$$

where f is the focal distance of the objective lens, Z is the length of the multipole element taken along the optical axis, $\mu_0$ is the magnetic permeability of vacuum, I is the coil current through the multipole element, $C_s$ is the spherical aberration coefficient of the objective lens, R is the magnetic rigidity of the electrons, and b is the bore radius of the multipole element.

According to the electron microscope of the present invention, spherical aberration can be corrected appropriately while minimizing undesired aberrations produced by the correction. That is, the operation for correcting spherical aberration can be performed well, accurately, and efficiently.

Other objects and features of the invention will appear in the course of the description thereof, which follows.

DESCRIPTION OF THE PREFERRED EMBODIMENTS

The preferred embodiments of the present invention are hereinafter described with reference to the accompanying drawings.

Figure 1:
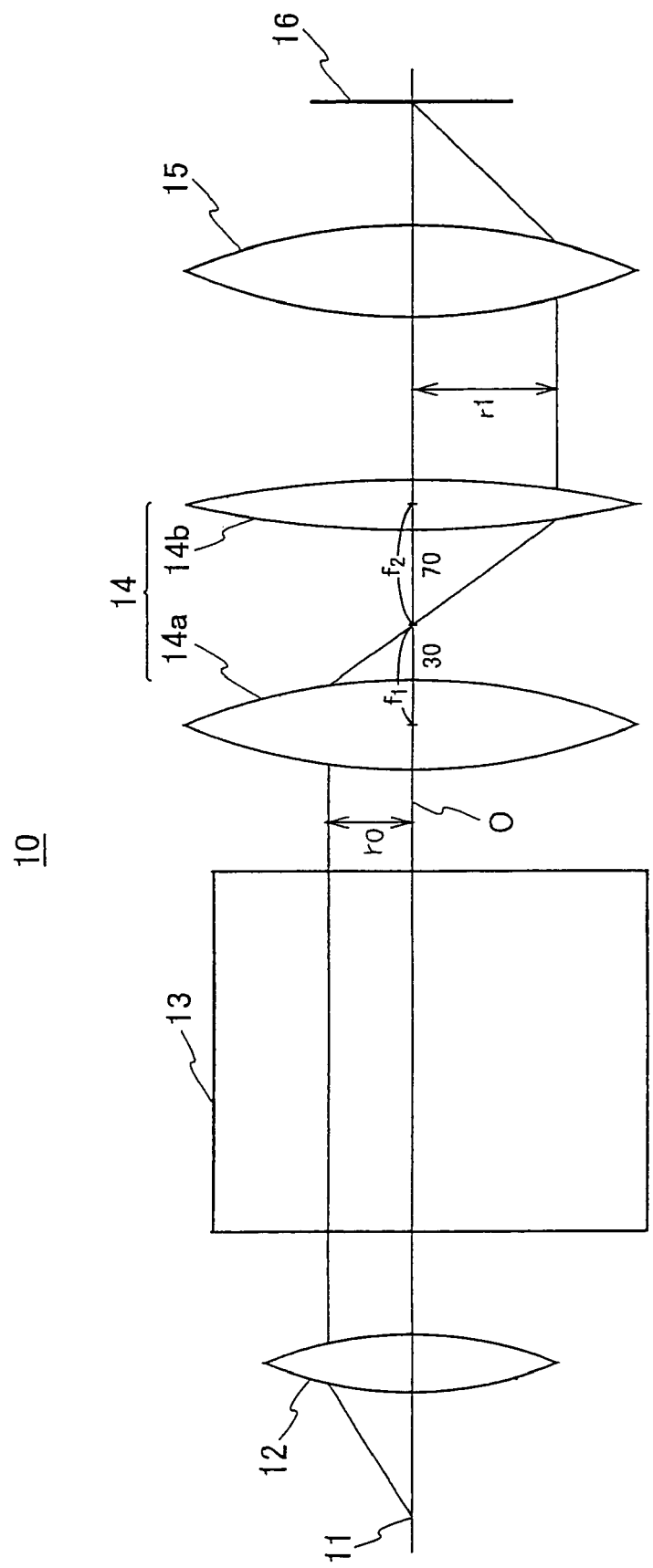
FIG. 1 is a diagram showing the configuration of an aberration correction system incorporated in an electron microscope according to the present invention.

FIG. 1 shows the configuration of an aberration correction system 10 incorporated in an electron microscope according to one embodiment of the present invention. This correction system 10 comprises: an illumination optical system consisting of a source 11 and a condenser lens 12; a spherical aberration corrector 13; transfer optics 14 for transferring an electron beam including a term of aberration corrected by the corrector 13 to an objective lens 15; the objective lens 15 into which the electron beam from the transfer optics 14 is entered; and a specimen 16 at which the electron beam focused by the objective lens 15 is directed. The deflection system and parts of the focusing system are omitted in the figure.

The electron beam entered from the source 11 along the optical axis is almost collimated by the condenser lens 12 and made to hit the spherical aberration corrector 13. The corrector 13 uses a correction element consisting, for example, of a hexapole coil to correct the spherical aberration in the incident electron beam and to supply the beam to the transfer optics 14 as described later.

The transfer optics 14 is composed of a first lens 14a and a second lens 14b. Each of the first and second lenses is a magnetic lens, for example. The transfer optics 14 is inserted between the spherical aberration corrector 13 and objective lens 15. Electrons passing across a location at a distance r0 from the axis within the multipole element is made to hit the first lens 14a. Electrons are made to hit the second lens 14b from an incident point to the objective lens, the incident point being at a distance r1 from the optical axis. The ratio M of the distance r1 to the distance r0 is set to greater than 1.5, for example, as described later. The ratio M(=r1/r0) is equal to the ratio $f_2/f_1$, where $f_1$ is the focal distance of the first lens 14a and $f_2$ is the focal distance of the second lens 14b. Therefore, the ratio M(=$f_2/f_1$) may be set to greater than 1.5.

In a related-art design of the spherical aberration correction system, focusing is done usually at a magnification of 1, i.e., r0=r1, when electrons passing across the spherical aberration corrector 52 at the distance r0 from the optical axis enter the objective lens 54 at the distance r1 from the optical axis O. The correction system may also be so designed that the relationship r0<r1 holds. It has not been heretofore pointed out that the relationship r0<r1 yields advantages. Furthermore, any appropriate design value of the ratio r1/r0 has not been discussed from a technical point of view.

In the aberration correction system 10 shown in FIG. 1, the transfer optics 14 satisfying the relationship r0<r1 (on the assumption that r1/r0=M) is disposed between the spherical aberration corrector 13 and the objective lens 15 as described previously. As described above, the ratio M(=r1/r0) is equal to the ratio $f_2/f_1$, where $f_1$ is the focal distance of the first lens 14a and $f_2$ is the focal distance of the second lens 14b. In this case, the optical effect to be discussed first is transfer of aberrations.

In particular, if an aberration coefficient C produced by the spherical aberration corrector 13 has an order n (nth aberration), the aberration coefficient C is converted into an aberration coefficient $X_0$ in the objective lens 15, using a coefficient $(1/M)^{n+1}$.

$$X_0 = \left(\frac{1}{M}\right)^{n+1} C \qquad (1)$$

That is, as the ratio M=r1/r0 is increased, aberration produced by the corrector 13 decreases on the specimen surface. Thus, the corrector 13 produces a spherical aberration of the opposite sign in the objective lens 15, thus canceling out the spherical aberrations.

Figure 2:
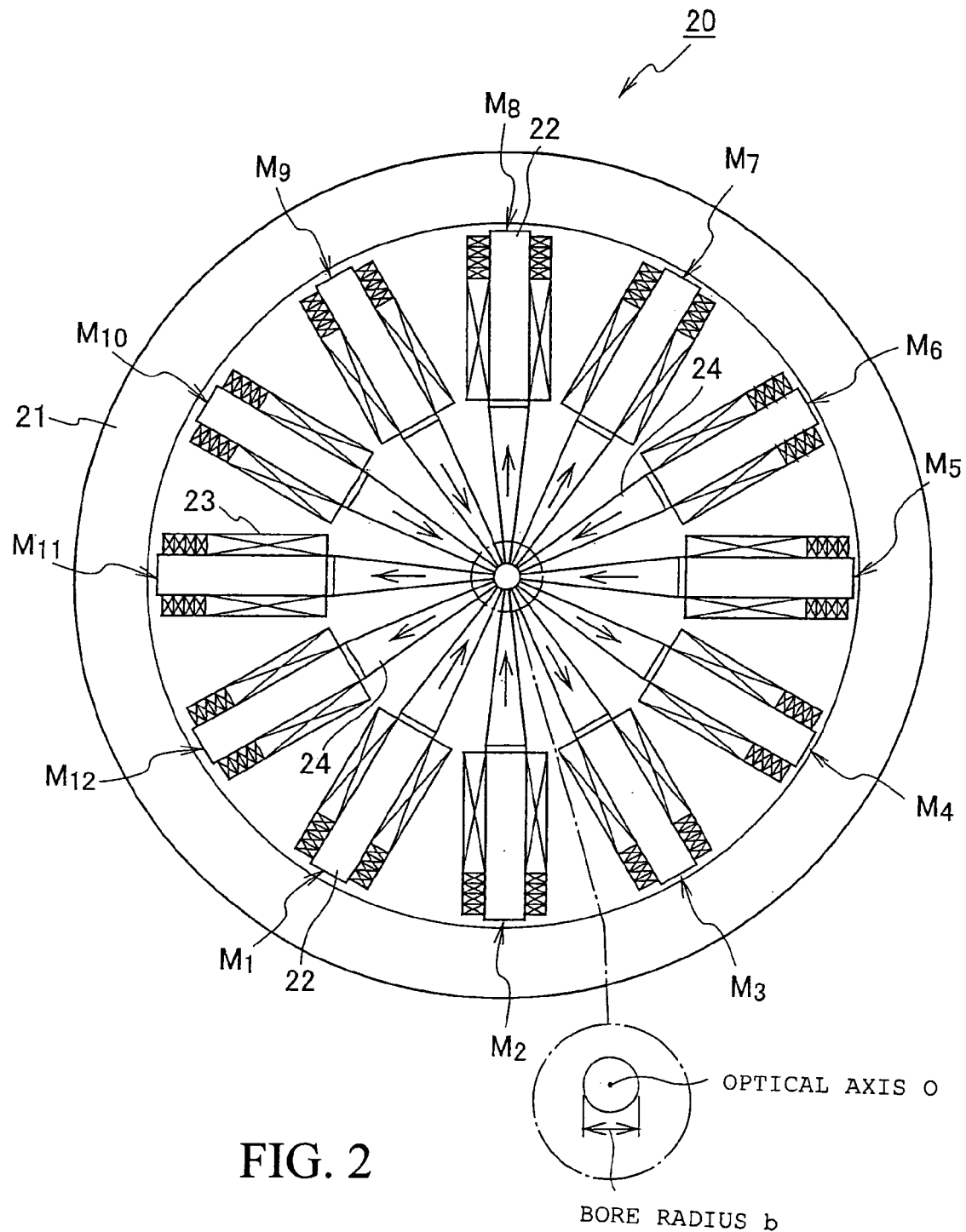
FIG. 2 is a cross-sectional view of a 12-pole corrector element forming a spherical aberration corrector.

FIG. 2 is a cross-sectional view of a dodecapole (12-pole) corrector element 20 constituting the spherical aberration corrector 13. The corrector element 20 has deflection coils arranged around the optical axis to produce six magnetic fields using 12 magnetic poles. In particular, the corrector element 20 has 12 magnetic poles $M_1, M_2, \ldots, M_{12}$ arranged from an outer yoke 21 toward the optical axis. Polar elements 24 are formed from cores 22 toward the optical axis by the magnetic poles. The arrows attached to the polar elements 24 indicate the senses of the magnetic fields. In this corrector element 20, an exciting coil 23 is wound around each core 22 such that first magnetic pole pair ($M_1$ and $M_2$), second magnetic pole pair ($M_5$ and $M_6$), and third magnetic pole pair ($M_9$ and $M_{10}$) produce magnetic fields in the same direction. An exciting coil 23 is wound around each core 22 of magnetic pole pairs ($M_3$ and $M_4$; $M_7$ and $M_8$; and $M_1$ and $M_{12}$) to produce magnetic fields in the opposite direction. Consequently, six polar elements 24 are formed. As a result, a hexapole field is produced around the optical axis O. Hence, the spherical aberration corrector 13 having the corrector element 20 is known as a spherical aberration corrector of the hexapole field type.

A spherical aberration coefficient $C_{st}$ including contribution $X_0$ can be reduced below a given value (i.e., substantially canceled out) by satisfying the relation $C_{st}=C_s+X_0$, where $C_s$ is the spherical aberration coefficient $C_s$ intrinsic to the objective lens 15. This is achieved by adding the contribution $X_0$ to the electron beam hitting the spherical aberration corrector 13 through the condenser lens 12, the corrector 13 being formed by the 12-pole corrector element 20. Preferably, the given value is 0.05 mm, more preferably 0.01 mm. Still preferably, the given value is 0.005 mm.

Figure 3:
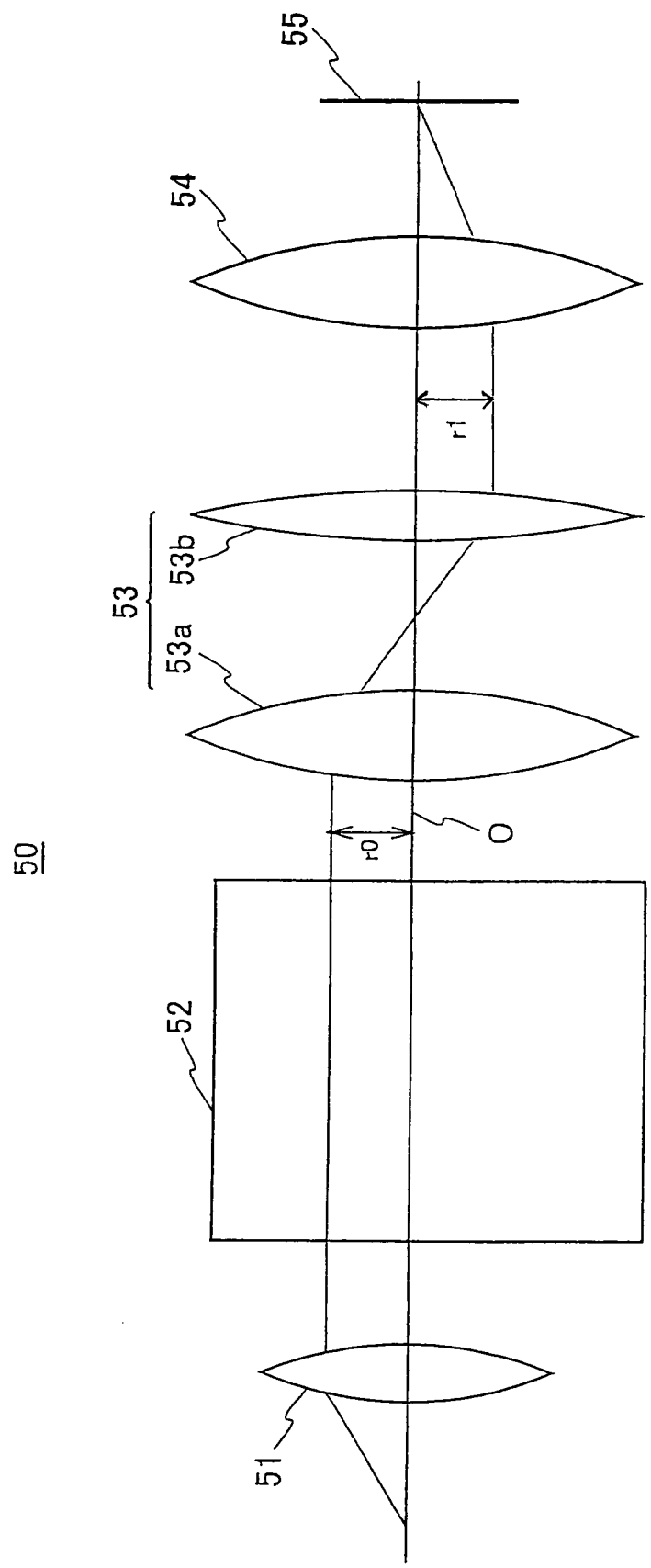
FIG. 3 is a diagram showing the configuration of an aberration correction system incorporated in a related-art electron microscope.

The aberration correction system 50 of FIG. 3 is now discussed as an example. Where the spherical aberration coefficient $C_s$ of the objective lens 54 is 1.0 mm, it is assumed that the magnification M=(r1/r0) is set equal to 1 by producing a spherical aberration Csc=−1.0 mm by the spherical aberration corrector 52. Taking account of the fact that the spherical aberration is a third order aberration, i.e., n=3, the spherical aberration coefficient $C_{st}$ of the objective lens 54 including the contribution from the corrector 52 is given by $$C_{st}=C_s+X_0=1-(1/1)^{3+1} \qquad (2)$$

In this way, the spherical aberration is corrected.

In contrast, in the aberration correction system 10 according to the present embodiment shown in FIG. 1, if the ratio M is set greater than 1 while maintaining the contribution $X_0$ of Eq. (1) at −1 mm, it is necessary to increase the spherical aberration coefficient $C_{st}$ to be produced by the spherical aberration corrector 13 by the fourth power of the ratio M compared with the case where M is 1. That is, if the ratio M is set greater than 1, the required correcting force is increased. This is disadvantageous in terms of the correction efficiency of the corrector in correcting $C_s$. This also forms a background behind which the aberration correction system 50 is designed with M=1, i.e., by the related-art method.

Meanwhile, undesired aberrations other than the spherical aberration necessary for correction are produced from the spherical aberration correctors 13 and 52 shown in FIGS. 1 and 3. Of these undesired aberrations, third-order star aberration ($S_3$) and third-order four-fold astigmatism ($A_3$) principally affect the performance of the spherical aberration correctors 13 and 52. Although the first-order astigmatism ($A_1$) and second-order coma ($B_2$) also occur, they do not present major problems because it is easy to correct them.

As can be seen from the description provided so far, increasing the ratio M reduces the values of $C_{sc}$, $S_3$, and $A_3$ produced on the specimen surface by the spherical aberration corrector 13 of FIG. 1. For example, if M is set to 70/30, the values of $C_{sc}$, $S_3$, and $A_3$ on the specimen surface are approximately $(1/M)^{3+1}$=3.4% of the values obtained by the related-art design (M=1). Accordingly, if M=70/30, it is necessary to design an aberration corrector capable of showing spherical aberration-correcting power that is higher than the power of the aberration corrector system 50 with M=1 by a factor of $M^{3+1}$ (=about 30).

When the ratio M=70/30 is used, the current I fed to the coil is increased or the bore radius b of the multipole element is reduced to increase the spherical aberration-correcting power (i.e., the spherical aberration coefficient $C_{sc}$ produced by the aberration corrector) by a factor of $M^{3+1}$ (about 30), increases in the undesired aberrations $S_3$ and $A_3$ present problems. If the increases in the undesired aberrations $S_3$ and $A_3$ are lower than the factor of $M^{3+1}$ (=about 30), then the spherical aberration corrector 13 reduces the undesired aberrations $S_3$ and $A_3$ compared with the aberration-correcting power $C_{sc}$. When the correcting power of the spherical aberration corrector 13 is increased, it is important not to vary the apparent size of the corrector to secure added value.

One method of improving the correcting power without varying the apparent geometry of the aberration corrector designed with M=1 and included in a TEM or STEM of 200 to 300 kV is to increase the current coil I through the multipole element built in the aberration corrector. Another method is to reduce the bore radius b of the multipole element. The relationship between spherical aberration-correcting power $C_{sc}$, coil current I, and bore radius b is given by $$C_{sc} = \frac{C_1 I^2}{b^6} \quad (3)$$

where $C_1$ is a proportionality constant and includes the magnetic rigidity R of electrons determined by the accelerating voltage, the length Z of the multipole element taken along the optical axis, the magnetic permeability $\mu_0$ of vacuum, and the focal distance f of the objective lens. Thus, $$C_1 = \frac{6f^4 Z^3 \mu_0^2}{R^2} \quad (4)$$

Meanwhile, the aberrations $S_3$ and $A_3$ are given by $$S_3 = \frac{C_2 I}{b^2} \quad (5)$$

$$A_3 = \frac{C_3 I}{b^4} \quad (6)$$

The dependences of the current I and bore radius b are different than in the spherical aberration-correcting power.

Let F be a coefficient representing a fringing effect of a magnetic field. Proportionality constants $C_2$ and $C_3$ are given by $$C_2 = \frac{2Ff^2 Z \mu_0}{R} \quad (7)$$

$$C_3 = \frac{4\mu_0 f^4 Z}{R} \quad (8)$$

It can be seen from Eqs. (3), (5), and (6) that where the correcting power $C_{sc}$ for $C_s$ is increased by a factor of m by increasing the current I or reducing the bore radius b of the multipole element, the resulting increases in the third-order star aberration $S_3$ and in the third-order four-fold astigmatism $A_3$ are as listed in Table 1 below.

TABLE 1

|   | $C_{sc}$ is increased m-fold by increasing I. | $C_{sc}$ is increased m-fold by reducing b. |
|---|---|---|
| $S_3$ | $m^{1/2}$ | $m^{1/3}$ |
| $A_3$ | $m^{1/2}$ | $m^{2/3}$ |

It can be seen from Table 1 that if the spherical aberration $C_{sc}$ is increased m-fold by increasing the current, $S_3$ and $A_3$ increase by a factor of $m^{1/2}$ but that if $C_{sc}$ is increased by reducing the bore radius, $S_3$ and $A_3$ increase by factors of $m^{1/3}$ and $m^{2/3}$, respectively. Accordingly, the values of the $S_3$ and $A_3$ can be more efficiently reduced relative to the $C_{sc}$ by reducing the bore radius b.

In summary, in designing an aberration corrector, the effective values of the undesired aberrations $S_3$ and $A_3$ produced in the corrector are reduced by minimizing the bore radius b of the multipole element and, at the same time, by setting the corrective current I to a large value and converting a large aberration-corrective power produced with the small bore radius and large current into the ratio M of the transfer optics given by Eq. (9) below.

$$M = \left(\frac{6f^4 Z^3 \mu_0^2 I^2}{C_s R^2 b^6}\right)^{1/4} \quad (9)$$

The ratio M can be increased or reduced to some extent without difficulties within practical ranges of design. However, there is a technical limitation in reducing the bore radius b. Therefore, if the aberration corrector is designed after setting the bore radius of the multipole element to its achievable lower limit, aberration correction conditions giving small absolute values of $S_3$ and $A_3$ can be accomplished.

In the cases of TEM and STEM, liner tubes for hermetic sealing are mounted above and below the objective lens. To secure sufficient field of view at low magnifications and cleanliness of the inside of the tubes, the outside diameter of the liner tubes that can be used technically is 4 mm. The liner tubes pass through bores inside the multipole element built in the aberration corrector. The alignment margin between each tube and bore is considered to be approximately 1 mm. It is considered that the bore diameter is 5 mm. That is, the lower limit of the bore radius b is about 2.5 mm.

The magnetomotive force (current I) capable of being produced to create a hexapole field at the front end of the multipole element having a bore radius b=2.5 mm is about 100 A. Under conditions where the accelerating voltage is 300 kV, Z=20 mm, $C_s$=1.0 mm, f=2.5 mm, b=5/2 mm, R=0.0021 Kg/C$_s$ for 300 keV electron, and $\mu_0$=1.26×10$^{-6}$ H/m, a design value of the ratio M matched to the above-described magnetomotive force is given by $$M = \left(\frac{6f^4 Z^3 \mu_0^2 I^2}{C_s R^2 b^6}\right)^{1/4} = 2.3 \quad (10)$$

That is, M=r1/r0=70/30.

The contents of the present invention are summarized now. In the related-art spherical aberration corrector, the ratio M of the transfer optics is 1. In the present embodiment of this invention, M is set to 2.3. The bore radius b of the multipole element is set to a small value, for example, 2.5 mm. Consequently, mixing of undesired aberrations can be prevented. As a result, the aberration corrector operates efficiently.

It is to be noted that the ratio M is not limited to the numerical value of 2.3. The ratio should be greater than 1. Preferably, the ratio is in excess of 1.5. That is, in an electron microscope according to an embodiment of the present invention, transfer optics are mounted as an aberration correction system between a multipole element and an objective lens. In the transfer optics, the ratio M(=r1/r0) is set greater than 1.5, where r1 is the distance of the incident point to the objective lens for electrons from the optical axis, the electrons passing across a point located at the distance r0 from the axis within the multipole element. The coil current I of the multipole element and the bore radius b of the multipole element are so determined that the spherical aberration coefficient $C_s$ of the objective lens is canceled out.

Especially, where the electron microscope has an aberration correction system equipped with a hexapole-field spherical aberration corrector using a multipole element, the bore radius b of the multipole element is selected from the range from 2 to 3 mm and preferably set as given by Eq. (12) and the ratio M is set as given by Eq. (11).

$$M = \left( \frac{6f^4 Z^3 \mu_0^2 I^2}{C_s R^2 b^6} \right)^{1/4} \quad (11)$$

$$b = 2.5 \text{ mm} \quad (12)$$

It is to be understood that the above embodiment merely shows one specific form of the present invention and that the invention is not limited thereto.

Having thus described my invention with the detail and particularity required by the Patent Laws, what is desired protected by Letters Patent is set forth in the following claims.

The invention claimed is:

1. An electron microscope comprising:
a spherical aberration corrector using a multipole element excited with a coil current I, the multipole element having a bore radius of b;
an objective lens; and
transfer optics mounted between the multipole element and the objective lens,
wherein the transfer optics is so designed that ratio M(=r1/r0) is set greater than 1, the distance r1 being the distance of an incident point to the objective lens for electrons from an optical axis, the electrons passing across a point located at the distance r0 from the optical axis within the multipole element, and
wherein at least one of the current I and the bore radius b of the multipole element is so determined that spherical aberration coefficient $C_{st}$ of the objective lens including contribution $X_0$ from the spherical aberration corrector is set to less than a given value.

2. An electron microscope as set forth in claim 1, wherein said given value is 0.05 mm.

3. An electron microscope as set forth in claim 1, wherein said given value is 0.01 mm.

4. An electron microscope as set forth in claim 1, wherein said given value is 0.005 mm.

5. An electron microscope as set forth in claim 1, wherein said ratio M is greater than 1.5.

6. An electron microscope as set forth in claim 1, wherein said spherical aberration corrector using said multipole element produces a hexapole field, and wherein the bore radius b of the multipole element is set to 2 to 3 mm.

7. The electron microscope of claim 1, wherein said spherical aberration corrector using said multipole element produces a hexapole field, and wherein said ratio M is given by $$M = \left( \frac{6f^4 Z^3 \mu_0^2 I^2}{C_s R^2 b^6} \right)^{1/4}$$

where f is the focal distance of the objective lens, Z is the length of the multipole element taken along the optical axis, $\mu_0$ is the magnetic permeability of vacuum, I is the coil current through the multipole element, $C_s$ is the spherical aberration in the objective lens, R is the magnetic rigidity of the electrons, and b is the bore radius of the multipole element.

* * * * *